United States Patent [19]
Nishimura et al.

[11] Patent Number: 5,160,422
[45] Date of Patent: Nov. 3, 1992

[54] BATH FOR IMMERSION PLATING TIN-LEAD ALLOYS

[75] Inventors: Shigefumi Nishimura, Yawata; Masao Fukuda, Takatsuki; Yoshiji Shimizu, Higashiosaka, all of Japan

[73] Assignee: Shimizu Co., Ltd., Osaka, Japan

[21] Appl. No.: 530,169

[22] Filed: May 29, 1990

[30] Foreign Application Priority Data

May 29, 1989 [JP] Japan ................................ 1-136957
Jun. 2, 1989 [JP] Japan ................................ 1-141874

[51] Int. Cl.$^5$ ........................... C25D 3/32; C25D 3/36
[52] U.S. Cl. ................................... 205/254; 106/1.22; 106/1.25
[58] Field of Search ........................... 204/44.4, 54.1; 106/1.22, 1.25; 205/254

[56] References Cited

U.S. PATENT DOCUMENTS

| | | | |
|---|---|---|---|
| 4,194,913 | 3/1980 | Davis | 106/1.22 |
| 4,511,403 | 4/1985 | Orio et al. | 106/1.22 |
| 4,749,626 | 6/1988 | Kadija et al. | 204/44.4 |
| 4,849,059 | 7/1989 | Deresh et al. | 204/44.4 |

*Primary Examiner*—Steven Marquis
*Attorney, Agent, or Firm*—Wenderoth, Lind & Ponack

[57] ABSTRACT

The invention provides a bath for immersion plating a substance with a tin-lead alloy, which includes tin(II) ions, lead(II) ions, organic sulfo groups and thiourea or a mixture of thiourea and a thiourea derivative for a complexing agent. The organic sulfo groups allow insoluble thiourea complexes to be stably dissolved in the solution of the bath; thereby there is no need to retain the bath at a high temperature. Compared with conventional baths for immersion plating, the bath of the invention attains stable plating and a longer life of itself. Addition of the thiourea derivative prevents whiskers from being deposited and allows uniform and sufficiently smooth plating.

3 Claims, 5 Drawing Sheets

BATH FOR IMMERSION PLATING TIN-LEAD ALLOYS

BACKGROUND OF THE INVENTION

1. Field of the Invention

The present invention relates to a bath for immersion tin-lead plating on copper or copper alloys used for electrodes of various electronic circuit elements.

2. Prior Art

Copper and copper alloys are widely used for various electrodes or lines of printed circuit boards packaging electronic circuit elements. The electrodes or the circuit lines may be plated with tin. In the course of tin-plating, however, whiskers are frequently observed as shown in Reference 1 and FIG. 7, which may cause a short-circuit.

In tin-lead plating, on the other hand, whiskers are observed less frequently and to a less extent; especially when the content of lead exceeds 5%, whiskers are substantially prevented. Tin-lead plating attains high corrosion resistance and excellent solderability, thus being applied to variety of electrodes or circuit lines so as to improve their quality and to simplify the manufacturing process.

Electroplating is a general practice for plating a substance with a tin-lead alloy. Both the anode and the cathode, the substance, are dipped in an electrolytic solution including stannic or stannous ions and lead ions; electric current is then supplied to the solution to plate the substance with a tin-lead alloy.

In electroplating, however, current density varies depending on the region of the substance; the thickness of the plating layer is thus not uniform. Furthermore, electrically insulated substances cannot be electroplated.

The advanced electronics technology attains compact designs and multi-functions and high performance of electrical appliances. A highly efficient plating method is thus highly required for plating circuit boards, semiconductors, etc.

Immersion plating method is adopted for the above purpose. Immersion plating does not require electricity for plating, and thereby any substance can be plated irrespective of the shape and electric conductivity.

For immersion plating, acidic immersion-plating bathes are prepared by mixing thiourea, fluoroboric acid, a chelating agent and hydrochloric acid with tin chloride, lead acetate, tin fluoroborate and lead fluoroborate. As shown in Reference 2, when the bath contains a relatively high concentration of chloride ions, lead chloride-thiourea complexes precipitate, which are sparingly soluble at a room temperature. Since the precipitate prevents plating, the bath should be maintained at a higher temperature. Otherwise, the complexes are suspended in the bath and easily deteriorate the bath.

When the substance is wet, water drops attached to the substance partially lower the temperature of the plating bath; as a result, the above complexes are precipitated to prevent the substance from being plated uniformly. Lead deposits more easily than tin, and thus a desirable composition of tin-lead plating is difficult to be obtained.

SUMMARY OF THE INVENTION

The objective of the invention is accordingly to provide a immersion plating bath which attains highly improved quality of tin-lead plating.

A bath according to the invention for immersion plating a substance with a tin-lead alloy includes tin(II) ions, lead(II) ions, organic sulfo groups and thiourea for a complexing agent.

Another feature of the invention is a bath for immersion plating a substance with a tin-lead alloy, which includes tin(II) ions, lead(II) ions, organic sulfo groups as a mixture of thiourea and a thiourea derivative as a complexing agent.

In the immersion plating bath of the invention, before plating starts, thiourea or a mixture of thiourea and a thiourea derivative complexes the metal surface of a substance. The deposition potential of tin and lead then becomes more noble than the metal surface and a replacement plating reaction occurs accordingly.

Thiourea or a mixture of thiourea and a thiourea derivative is dissolved in the immersion plating bath of the invention, thus controlling the deposition rate of tin and lead and the content of lead in a plating layer. Addition of a thiourea derivative prevents lead dendrites from being deposited and allows uniform and sufficiently smooth plating.

The immersion plating bath of the invention includes organic sulfo groups which allow insoluble thiourea complexes to be stably dissolved in the solution of the bath; thereby there is no need to retain the bath at a high temperature. Compared with conventional baths for immersion plating, the bath of the invention attains stable plating and a longer life of itself.

Tin(II) ions and lead(II) ions used in the invention are obtained from, for example, tin phenolsulfonate, tin alkanesulfonates and tin hydroxyalkanesulfonates and lead phenolsulfonate, lead alkanesulfonates and lead hydroxyalkanesulfonates, respectively. Water-soluble inorganic compounds including tin and lead may also be used.

When an organic acid like tartaric acid, succinic acid or citric acid and an anionic surfactant are further added to the bath, thiourea is dissolved in such an amount as to exert its effects.

The thiourea derivative used with thiourea is shown as:

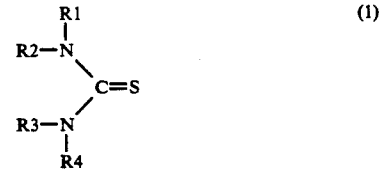

(1)

in which: at least one of the atomic groups R1 through R4 should be functional groups other than —H; for example, alkyl groups containing 1 to 2 carbon atoms, sulfo groups and methylol groups.

The thiourea derivative is, for example, dimethylol thiourea, 1-acetyl-2-thiourea, monomethyl thiourea, dimethyl thiourea, trimethyl thiourea, monoethyl thiourea and 1,3-diethyl thiourea.

Though some of thiourea derivatives are sparingly soluble in water, they can be dissolved in the bath in the following manner. A certain amount of thiourea and a smaller amount of thiourea derivative are added together to the bath. An organic acid like tartaric acid, succinic acid or citric acid and an anionic and nonionic surfactant are further added to dissolve thiourea and thiourea derivative in such an amount as to exert their effects.

Organic sulfo groups used in the invention are obtained from, for example, aromatic sulfonates shown as formula (2), alkanesulfonates and hydroxyalkanesulfonates. Other compounds which liberate sulfo groups may be used.

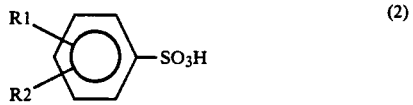

in which: R1 and R2 may be identical or different groups and are hydrogen atoms, hydroxyl groups, carboxyl groups or lower alkyl groups containing 1 to 3 carbon atoms.

Alkanesulfonate is, e.g., methanesulfonate and ethanesulfonate, and hydroxyalkanesulfonate is, e.g., hydroxydiethylsulfonate and hydroxypropylsulfonate.

A first embodiment of the immersion plating bath of the invention preferably includes 3 to 50 g/l of tin(II) ions, 3 to 50 g/l of lead(II) ions, 30 to 200 g/l of thiourea, and 6 to 400 g/l, or more preferably 60 to 400 g/l of organic sulfo groups.

A second embodiment of the immersion plating bath of the invention preferably includes 3 to 50 g/l of tin(II) ions, 3 to 50 g/l of lead(II) ions, 3 to 150 g/l of thiourea and a thiourea derivative in an amount smaller than thiourea and 6 to 400 g/l, or more preferably 60 to 400 g/l of organic sulfo groups.

The composition of the invention may also include chlorides and fluoroborates. Chlorides are, for example, hydrochloric acid, inorganic chlorides like zinc chloride, aluminum chloride, lithium chloride and sodium chloride, hydrochloride of amines like monoethanolamine hydrochloride and triethanolamine hydrochloride and hydrochloride of cationic surfactants.

In Example 9 and Example 11 described below, aluminum chloride is added to a immersion plating bath, instead of hydrochloric acid generally used, to control pH of the bath. Aluminum chloride is easily dissolved in an organic solution, in this case, a solution of thiourea or a mixture of thiourea and a thiourea derivative, thus effectively preventing precipitation. Furthermore, aluminum chloride improves the deposition rate of tin-lead alloy and thereby attains fine plating. Since aluminum ions $Al^{3+}$ have a deposition rate baser than those of lead and tin of a plating layer, codeposition of aluminum is prevented. The content of aluminum chloride is preferable at 0.01 through 0.2 mol/l.

Fluoroborates are, for example, fluoroboric acid, lead fluoroborate and tin fluoroborate. An excess of fluoroborate may corrode insulated boards like printed circuit boards. Fluoroborates are poisonous to human bodies; thus specific facilities should be provided for treating the waste effectively. The upper limit of the content of fluoroborates is determined with the above factors considered.

As shown in Examples of immersion plating baths, a composition excluding chlorides and fluoroborates also provides fine plating.

Brightening agents like peptone, glue or gelatin may be added to the immersion plating bath of the invention.

Since the electric charge is not shifted on a substance in the invention, no reducing agents are required. But some reducing agents may be added for preventing oxidization by oxygen in the air; e.g., sodium hypophosphite or hydrazine hydrochloride.

The plating bath of the invention is stirred mechanically or with ultrasonic to accelerated the replacement reaction. The physical energy applied to the solution attains fine plating in appearance and properties. In Examples described below, a plating bath is mechanically stirred with a motor.

The plating bath of the invention provides a smooth and fine grained deposit which has a uniform thickness and is free from whiskers.

The bath of the invention is thus preferably used for circuit boards with complicated and delicate patterns; for example, used for packaging semi-conductor chips by tape carrier method. Though immersion tin plating is generally used for the purpose, the plating bath of the invention provides finer and durable tin-lead plating.

In manufacturing process of copper through hole printed circuit boards by subtractive method, tin-lead alloy remove method is applied. Though electric tin-lead alloy plating is generally used for the purpose, immersion plating of the invention is preferably used instead. The bath of the invention is especially effective for through holes in smaller diameters. The bath of the invention is also used for making metal-resist in manufacturing process of printed boards.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
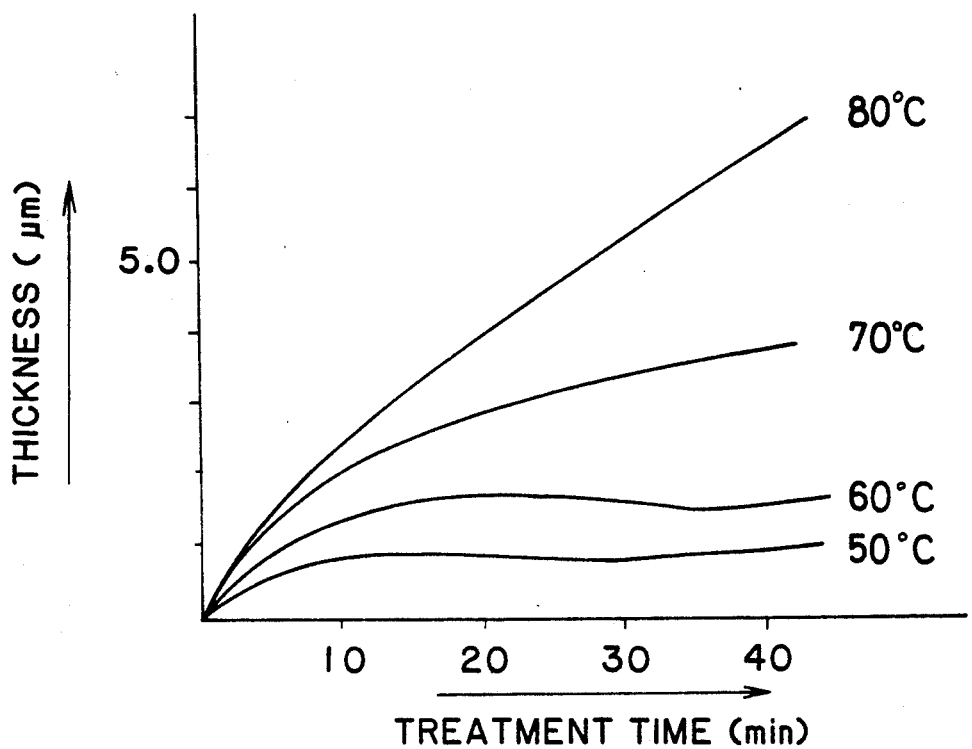
FIG. 1 shows the relationship between the treatment time and the thickness of the plating layer in a immersion plating bath of a first embodiment.

Now referring to the drawings, examples of the invention are described below.

Examples 1 to 7 are for the plating bath of the first embodiment, and Examples 8 to 16 for that of the second embodiment. Examples 17 to 34 show the relationship between the amount of thiourea derivative added and the composition of the plating layer. Examples 35 to 42 show the variation of the composition of the plating layer against the concentration change of Sn and Pb.

EXAMPLE 1

A immersion tin-lead alloy plating bath is prepared according to the composition in Table 1.

TABLE 1

| stannous p-phenolsulfonate | 39.2 g/l |
|---|---|
| p-phenolsulfonic acid | 60 g/l |
| thiourea | 80 g/l |
| lead fluoroborate solution (42%) | 40 g/l |
| peptone | 1 g/l |

The plating bath prepared is heated to 70° C. A copper board (5×5 cm), which has previously been electrolytically degreased, neutralized with acid and washed, is dipped in the plating bath for 15 minutes. The plating layer obtained has smooth surface and uniform thickness of 0.6 micrometer. The composition of the layer is 54% tin and 46% lead.

EXAMPLE 2

A immersion tin-lead alloy plating bath is prepared according to the composition shown in Table 2.

TABLE 2

| stannous p-phenolsulfonate | 39.2 g/l |
|---|---|
| lead p-phenolsulfonate | 26.7 g/l |
| p-phenolsulfonic acid | 40 g/l |
| thiourea | 80 g/l |
| lead fluoroborate solution (42%) | 26 g/l |
| peptone | 1 g/l |

The plating bath prepared is heated to 70° C. A copper board (5×5 cm), which has previously been electrolytically degreased, neutralized with acid and washed, is dipped in the plating bath for 15 minutes. The plating layer obtained has smooth and fine grained deposit and uniform thickness of 0.5 micrometer. The composition of the layer is 62% tin and 38% lead.

EXAMPLE 3

A immersion tin-lead alloy plating bath is prepared according to the composition shown in Table 3.

TABLE 3

| stannous p-phenolsulfonate | 39.2 g/l |
|---|---|
| lead p-phenolsulfonate | 26.7 g/l |
| thiourea | 100 g/l |
| p-phenolsulfonic acid | 80 g/l |
| fluoroboric acid | 26 g/l |
| peptone | 4 g/l |
| polyoxyethylene (10) octylphenylether | 10 g/l |
| concentrated hydrochloric acid | 30 ml/l |

The plating bath prepared is heated to 60° C. A copper board (5×5 cm), which has previously been electrolytically degreased, neutralized with acid and washed, is dipped in the plating bath for 15 minutes. The plating layer obtained has smooth surface and uniform thickness of 2.9 micrometer. The composition of the layer is 70% tin and 30% lead.

EXAMPLE 4

A immersion tin-lead alloy plating bath is prepared according to the composition shown in Table 4.

TABLE 4

| stannous p-phenolsulfonate | 39.2 g/l |
|---|---|
| lead p-phenolsulfonate | 26.7 g/l |
| p-phenolsulfonic acid | 80 g/l |
| thiourea | 80 g/l |
| fluoroboric acid (45%) | 50 g/l |
| citric acid | 30 g/l |
| concentrated hydrochloric acid | 20 ml/l |

The plating bath prepared is heated to 60° C. A copper board (5×5 cm), which has previously been electrolytically degreased, neutralized with acid and washed, is dipped in the plating bath for 15 minutes. The plating layer obtained has smooth surface and uniform thickness of 2.1 micrometer. The composition of the layer is 73% tin and 27% lead.

EXAMPLE 5

A immersion tin-lead alloy plating bath is prepared according to the composition shown in Table 5.

TABLE 5

| stannous p-phenolsulfonate | 39.2 g/l |
|---|---|
| lead p-phenolsulfonate | 26.7 g/l |
| p-phenolsulfonic acid | 40 g/l |
| thiourea | 200 g/l |
| hydrogen fluoroborate | 50 g/l |
| sodium dodecylbenzenesulfonate | 0.2 g/l |
| polyoxyethylene (10) octylphenylether | 5 g/l |
| concentrated hydrochloric acid | 20 ml/l |

The plating bath prepared is heated. A copper board (5×5 cm), which has previously been electrolytically degreased, neutralized with acid and washed, is dipped in the plating bath.

FIG. 1 shows the relationship between the treatment time (dip time of the copper board) and the thickness of the plating layer at various temperatures of the plating bath.

Table 6 shows the relationship between the treatment time (dip time of the copper board) and the tin content (%) and the thickness of the plating layer at variety of temperatures of the plating bath.

TABLE 6

| Treatment time (dip time) | | | Temperature (°C.) | | | |
|---|---|---|---|---|---|---|
| | | | 50 | 60 | 70 | 80 |
| 5 | tin | (%) | 86 | 68 | 55 | 52 |
| | Thickness of plating layer | (μm) | 0.80 | 1.08 | 1.41 | 1.08 |
| 10 | tin | (%) | 91 | 74 | 55 | 52 |
| | Thickness of plating layer | (μm) | 0.98 | 1.57 | 2.25 | 1.61 |
| 15 | tin | (%) | 93 | 87 | 56 | 51 |
| | Thickness of plating layer | (μm) | 1.05 | 1.42 | 3.40 | 2.48 |
| 20 | tin | (%) | 95 | 82 | 80 | 53 |
| | Thickness of plating layer | (μm) | 1.06 | 1.81 | 2.80 | 4.31 |
| 30 | tin | (%) | 95 | 90 | 84 | 56 |
| | Thickness of plating layer | (μm) | 1.07 | 1.69 | 2.89 | 6.55 |
| 40 | tin | (%) | 95 | 89 | 79 | 56 |
| | Thickness of plating layer | (μm) | 1.19 | 1.88 | 3.56 | 6.31 |

As clearly seen in FIG. 1 and Table 6, the thickness and the tin-content of the plating layer increases with the increase of the temperature of the plating bath. Even the plating bath at relatively low temperatures, however, gives the plating layer of a sufficient thickness.

EXAMPLE 6

A immersion tin-lead alloy plating bath is prepared according to the composition shown in Table 7.

TABLE 7

| | |
|---|---|
| Sn(II) 2-hydroxypropylsulfonate | 33.4 g/l |
| Pb 2-hydroxypropylsulfonate | 23.4 g/l |
| 2-hydroxypropylsulfonic acid | 40 g/l |
| thiourea | 80 g/l |
| fluoroboric acid (45%) | 26 g/l |
| peptone | 1 g/l |

The plating bath prepared is heated to 70° C. A copper board (5×5 cm), which has previously been electrolytically degreased, neutralized with acid and washed, is dipped in the plating bath for 15 minutes. The plating layer obtained has smooth surface and uniform thickness of 0.9 micrometer. The composition of the layer is 59% tin and 41% lead.

EXAMPLE 7

A immersion tin-lead alloy plating bath is prepared according to the composition shown in Table 8.

TABLE 8

| | |
|---|---|
| Sn(II) 2-hydroxypropylsulfonate | 33.4 g/l |
| Pb 2-hydroxypropylsulfonate | 23.4 g/l |
| 2-hydroxypropylsulfonic acid | 80 g/l |
| thiourea | 100 g/l |
| fluoroboric acid (45%) | 26 g/l |
| peptone | 4 g/l |
| polyoxyethylene (10) octylphenylether | 10 g/l |
| concentrated hydrochloric acid | 30 ml/l |

The plating bath prepared is heated to 60° C. A copper board (5×5 cm), which has previously been electrolytically degreased, neutralized with acid and washed, is dipped in the plating bath for 15 minutes. The plating layer obtained has smooth surface and uniform thickness of 3.2 micrometer. The composition of the layer is 67% tin and 33% lead.

EXAMPLE 8

A immersion tin-lead alloy plating bath is prepared according to the composition shown in Table 9.

TABLE 9

| | |
|---|---|
| tin(II) 2-hydroxypropylsulfonate | 33.4 g/l |
| lead 2-hydroxypropylsulfonate | 23.4 g/l |
| 2-hydroxypropylsulfonic acid | 40 g/l |
| thiourea | 60 g/l |
| 1,3-dimethyl-2-thiourea | 40 g/l |
| tartaric acid | 30 g/l |

The plating bath prepared is heated to 60° C. A copper board (5×5 cm), which has previously been electrolytically degreased, neutralized with acid and washed, is dipped in the plating bath for 15 minutes. The plating layer obtained has smooth surface and uniform thickness of 0.9 micrometer. The composition of the layer is 77% tin and 23% lead.

EXAMPLE 9

A immersion tin-lead alloy plating bath is prepared according to the composition shown in Table 10.

TABLE 10

| | |
|---|---|
| stannous p-phenolsulfonate | 39.2 g/l |
| lead 2-hydroxypropylsulfonate | 23.4 g/l |
| p-phenolsulfonic acid | 40 g/l |
| 2-hydroxypropylsulfonic acid | 20 g/l |
| thiourea | 60 g/l |
| 1,3-dimethyl-2-thiourea | 40 g/l |
| tartaric acid | 30 g/l |
| aluminum chloride 6H$_2$O | 20 g/l |

The plating bath prepared is heated to 60° C. A copper board (5×5 cm), which has previously been electrolytically degreased, neutralized with acid and washed, is dipped in the plating bath for 15 minutes. The plating layer obtained has smooth and fine surface and uniform thickness of 2.3 micrometer. The composition of the layer is 89% tin and 11% lead.

EXAMPLE 10

A immersion tin-lead alloy plating bath is prepared according to the composition shown in Table 11.

TABLE 11

| | |
|---|---|
| stannous p-phenolsulfonate | 39.2 g/l |
| lead p-phenolsulfonate | 26.7 g/l |
| p-phenolsulfonic acid | 40 g/l |
| thiourea | 60 g/l |
| 1,3-dimethyl-2-thiourea | 40 g/l |
| sulfosalicylic acid | 20 g/l |
| fluoroboric acid (45%) | 50 g/l |
| concentrated hydrochloric acid | 15 ml/l |

The plating bath prepared is heated to 60° C. A copper board (5×5 cm), which has previously been electrolytically degreased, neutralized with acid and washed, is dipped in the plating bath for 15 minutes. The plating layer obtained has smooth surface and uniform thickness of 1.7 micrometer. The composition of the layer is 59% tin and 41% lead.

EXAMPLE 11

A immersion tin-lead alloy plating bath is prepared according to the composition shown in Table 12.

TABLE 12

| | |
|---|---|
| stannous p-phenolsulfonate | 39.2 g/l |
| lead fluoroborate (42%) | 40.7 g/l |
| p-phenolsulfonic acid | 20 g/l |
| thiourea | 60 g/l |
| 1,3-diethyl-2-thiourea | 40 g/l |
| tartaric acid | 30 g/l |
| aluminum chloride 6H$_2$O | 10 g/l |

The plating bath prepared is heated to 60° C. A copper board (5×5 cm), which has previously been electrolytically degreased, neutralized with acid and washed, is dipped in the plating bath for 15 minutes. The plating layer obtained has smooth surface and uniform thickness of 1.8 micrometer. The composition of the layer is 55% tin and 45% lead.

EXAMPLE 12

A immersion tin-lead alloy plating bath is prepared according to the composition shown in Table 13.

TABLE 13

| | |
|---|---|
| tin(II) 2-hydroxypropylsulfonate | 33.4 g/l |
| lead 2-hydroxypropylsulfonate | 23.4 g/l |
| 2-hydroxypropylsulfonic acid | 40 g/l |
| thiourea | 80 g/l |
| 1-acetyl-2-thiourea | 10 g/l |
| fluoroboric acid (45%) | 30 g/l |

TABLE 13-continued

| | |
|---|---|
| citric acid | 50 g/l |

The plating bath prepared is heated to 70° C. A copper board (5×5 cm), which has previously been electrolytically degreased, neutralized with acid and washed, is dipped in the plating bath for 15 minutes. The plating layer obtained has smooth surface and uniform thickness of 0.8 micrometer. The composition of the layer is 76% tin and 24% lead.

EXAMPLE 13

A immersion tin-lead alloy plating bath is prepared according to the composition shown in Table 14.

TABLE 14

| | |
|---|---|
| tin(II) methanesulfonate | 26.0 g/l |
| lead methanesulfonate | 19.2 g/l |
| methanesulfonic acid | 115 g/l |
| thiourea | 70 g/l |
| 1,3-diethyl-2-thiourea | 20 g/l |

The plating bath prepared is heated to 60° C. A rolled copper foil adhered onto a polyimide film (2.5×3 cm), which has previously been electrolytically degreased, neutralized with acid and washed, is dipped in the plating bath for 5 minutes. The plating layer obtained has smooth surface and uniform thickness of 0.64 micrometer. The composition of the layer is 86.5% tin and 13.5% lead.

EXAMPLE 14

A immersion tin-lead alloy plating bath is prepared according to the composition shown in Table 15.

TABLE 15

| | |
|---|---|
| tin(II) methanesulfonate | 26.0 g/l |
| lead methanesulfonate | 19.2 g/l |
| methanesulfonic acid | 115 g/l |
| thiourea | 70 g/l |
| 1,3-diethyl-2-thiourea | 20 g/l |
| fluoroboric acid (45%) | 10 g/l |

The plating bath prepared is heated to 60° C. A rolled copper foil adhered onto a polyimide film (2.5×3 cm), which has previously been electrolytically degreased, neutralized with acid and washed, is dipped in the plating bath for 5 minutes. The plating layer obtained has smooth surface and uniform thickness of 0.76 micrometer. The composition of the layer is 86.2% tin and 13.8% lead.

EXAMPLE 15

A immersion tin-lead alloy plating bath is prepared according to the composition shown in Table 16.

TABLE 16

| | |
|---|---|
| stannous p-phenolsulfonate | 39.2 g/l |
| lead p-phenolsulfonate | 26.7 g/l |
| p-phenolsulfonic acid | 140 g/l |
| thiourea | 70 g/l |
| 1,3-diethyl-2-thiourea | 20 g/l |

The plating bath prepared is heated to 60° C. A rolled copper foil adhered onto a polyimide film (2.5×3 cm), which has previously been electrolytically degreased, neutralized with acid and washed, is dipped in the plating bath for 5 minutes. The plating layer obtained has smooth surface and uniform thickness of 0.5 micrometer. The composition of the layer is 93.8% tin and 6.2% lead.

EXAMPLE 16

A immersion tin-lead alloy plating bath is prepared according to the composition shown in Table 17.

TABLE 17

| | |
|---|---|
| stannous p-phenolsulfonate | 39.2 g/l |
| lead fluoroborate (42%) | 40.7 g/l |
| p-phenolsulfonic acid | 140 g/l |
| thiourea | 70 g/l |
| 1,3-diethyl-2-thiourea | 20 g/l |
| fluoroboric acid (45%) | 10 g/l |

The plating bath prepared is heated to 60° C. A rolled copper foil adhered onto a polyimide film (2.5×3 cm), which has previously been electrolytically degreased, neutralized with acid and washed, is dipped in the plating bath for 5 minutes. The plating layer obtained has smooth surface and uniform thickness of 0.72 micrometer. The composition of the layer is 81.2% tin and 18.8% lead.

EXAMPLES 17 THROUGH 34

Immersion tin-lead alloy plating baths are prepared according to the compositions shown in Recipe 1 to Recipe 4. Each plating bath prepared is heated to 60° C. A rolled copper foil adhered onto a polyimide film (2.5×3 cm), which has previously been electrolytically degreased, neutralized with acid and washed, is dipped in each plating bath for 5 minutes.

The composition, thickness and appearance of the plating layer obtained are examined and shown in Tables 18 through 21.

The addition of a thiourea derivative, 1,3-dimethyl-2-thiourea or 1,3-diethyl-2-thiourea, improve the smoother surface, whiter color and excellent metallic luster, upon a plating layer.

| Recipe 1 | Example | | | | |
|---|---|---|---|---|---|
| | 17 | 18 | 19 | 20 | 21 |
| stannous p-phenolsulfonate (g/l) | 39.2 | 39.2 | 39.2 | 39.2 | 39.2 |
| p-phenolsulfonic acid (g/l) | 60.0 | 60.0 | 60.0 | 60.0 | 60.0 |
| lead fluoroborate (42%) (g/l) | 40.7 | 40.7 | 40.7 | 40.7 | 40.7 |
| thiourea (g/l) | 70 | 70 | 70 | 70 | 70 |
| 1,3-diethyl-2-thiourea (g/l) | 0 | 10 | 20 | 30 | 40 |
| citric acid (g/l) | 30 | 30 | 30 | 30 | 30 |
| fluoroboric acid (45%) (g/l) | 10 | 10 | 10 | 10 | 10 |
| AlCl$_3$.6H$_2$O (g/l) | 10 | 10 | 10 | 10 | 10 |

TABLE 18

| | Example | | | | |
|---|---|---|---|---|---|
| | 17 | 18 | 19 | 20 | 21 |
| Sn (%) | 45 | 53 | 64 | 73 | 78 |
| Pb (%) | 55 | 47 | 36 | 27 | 22 |
| Thickness (μm) | 1.3 | 1.04 | 1.32 | 1.47 | 1.60 |
| Appearance Color | smooth relatively black | smoother whiter | smoother whiter | smoother whiter | smoother whiter |

Recipe 2

| | Example | | | |
|---|---|---|---|---|
| | 22 | 23 | 24 | 25 |
| stannous p-phenolsulfonate (g/l) | 39.2 | 39.2 | 39.2 | 39.2 |
| p-phenolsulfonic acid (g/l) | 60.0 | 60.0 | 60.0 | 60.0 |
| lead fluoroborate (42%) (g/l) | 40.7 | 40.7 | 40.7 | 40.7 |
| thiourea (g/l) | 70 | 70 | 70 | 70 |
| 1,3-dimethyl-2-thiourea (g/l) | 10 | 20 | 30 | 40 |
| citric acid (g/l) | 30 | 30 | 30 | 30 |
| fluoroboric acid (45%) (g/l) | 10 | 10 | 10 | 10 |
| AlCl$_3$.6H$_2$O (g/l) | 10 | 10 | 10 | 10 |

TABLE 19

| | Example | | | |
|---|---|---|---|---|
| | 22 | 23 | 24 | 25 |
| Sn (%) | 54 | 66 | 77 | 86 |
| Pb (%) | 46 | 34 | 23 | 14 |
| Thickness (μm) | 1.24 | 1.31 | 1.45 | 1.94 |
| Appearance | smoother | smoother | smoother | smoother |
| Color | whiter | whiter | whiter | whiter |

Recipe 3

| | Example | | | | |
|---|---|---|---|---|---|
| | 26 | 27 | 28 | 29 | 30 |
| tin(II) 2-methane sulfonate (g/l) | 26.0 | 26.0 | 26.0 | 26.0 | 26.0 |
| lead 2-methane sulfonate (g/l) | 19.2 | 19.2 | 19.2 | 19.2 | 19.2 |
| 2-methane sulfonic acid (g/l) | 50 | 50 | 50 | 50 | 50 |
| thiourea (g/l) | 60 | 60 | 60 | 60 | 60 |
| 1,3-diethyl-2-thiourea (g/l) | 0 | 10 | 20 | 30 | 40 |
| citric acid (g/l) | 30 | 30 | 30 | 30 | 30 |
| fluoroboric acid (45%) (g/l) | 10 | 10 | 10 | 10 | 10 |

TABLE 20

| | Example | | | | |
|---|---|---|---|---|---|
| | 26 | 27 | 28 | 29 | 30 |
| Sn (%) | 59 | 72 | 77 | 78 | 82 |
| Pb (%) | 41 | 28 | 23 | 22 | 18 |
| Thickness (μm) | 1.30 | 0.62 | 0.88 | 1.27 | 1.53 |
| Appearance | smooth | smoother | smoother | smoother | smoother |
| Color | relatively black | whiter | whiter | whiter | whiter |

Recipe 4

| | Example | | | |
|---|---|---|---|---|
| | 31 | 32 | 33 | 34 |
| tin(II) 2-methane sulfonate (g/l) | 26.0 | 26.0 | 26.0 | 26.0 |
| lead 2-methane sulfonate (g/l) | 19.2 | 19.2 | 19.2 | 19.2 |
| 2-methane sulfonic acid (g/l) | 50 | 50 | 50 | 50 |
| thiourea (g/l) | 60 | 60 | 60 | 60 |
| 1,3-dimethyl-2-thiourea (g/l) | 10 | 20 | 30 | 40 |
| citric acid (g/l) | 30 | 30 | 30 | 30 |
| fluoroboric acid (45%) (g/l) | 10 | 10 | 10 | 10 |

TABLE 21

| | Example | | | |
|---|---|---|---|---|
| | 31 | 32 | 33 | 34 |
| Sn (%) | 77 | 79 | 82 | 88 |
| Pb (%) | 23 | 21 | 18 | 12 |
| Thickness (μm) | 0.63 | 0.98 | 1.20 | 1.68 |
| Appearance | smoother | smoother | smoother | smoother |
| Color | whiter | whiter | whiter | whiter |

EXAMPLES 35 THROUGH 42

Immersion tin-lead alloy plating baths are prepared according to the compositions shown in Recipe 5 and Recipe 6. Each plating bath prepared is heated to 60° C. A rolled copper foil adhered onto a polyimide film (2.5×3 cm), which has previously been electrolytically degreased, neutralized with acid and washed, is dipped in each plating bath for 5 minutes.

In Recipe 5 and Recipe 6, the concentrations of Sn and Pb in the plating bath are varied. The composition and thickness of the plating layer obtained are examined and shown in Tables 22 and 23.

Recipe 5

| | Example | | | |
|---|---|---|---|---|
| | 35 | 36 | 37 | 38 |
| tin(II) 2-methane sulfonate (g/l) | 26.0 | 26.0 | 26.0 | 26.0 |
| lead 2-methane sulfonate (g/l) | 9.6 | 15.3 | 19.2 | 28.8 |
| 2-methane sulfonic acid (g/l) | 115 | 115 | 115 | 115 |
| thiourea (g/l) | 70 | 70 | 70 | 70 |
| 1,3-diethyl-2-thiourea (g/l) | 20 | 20 | 20 | 20 |
| citric acid (g/l) | 20 | 20 | 20 | 20 |
| fluoroboric acid (45%) (g/l) | 10 | 10 | 10 | 10 |

TABLE 22

| | Example | | | |
|---|---|---|---|---|
| | 35 | 36 | 37 | 38 |
| Concentration of Sn in solution (g/l) | 10 | 10 | 10 | 10 |
| Concentration of Pb in solution (g/l) | 5 | 8 | 10 | 15 |
| Sn (%) | 94 | 91 | 83 | 70 |
| Pb (%) | 6 | 9 | 17 | 30 |
| Thickness (μm) | 0.55 | 0.59 | 0.72 | 0.89 |

Recipe 6

| | Example | | | |
|---|---|---|---|---|
| | 39 | 40 | 41 | 42 |
| tin(II) 2-methane sulfonate (g/l) | 39.0 | 39.0 | 39.0 | 39.0 |
| lead 2-methane sulfonate (g/l) | 9.6 | 15.3 | 19.2 | 28.8 |
| 2-methane sulfonic acid (g/l) | 115 | 115 | 115 | 115 |
| thiourea (g/l) | 70 | 70 | 70 | 70 |
| 1,3-diethyl-2-thiourea (g/l) | 20 | 20 | 20 | 20 |
| citric acid (g/l) | 20 | 20 | 20 | 20 |
| fluoroboric acid (45%) (g/l) | 10 | 10 | 10 | 10 |

TABLE 23

| | Example | | | |
|---|---|---|---|---|
| | 39 | 40 | 41 | 42 |
| Concentration of Sn in solution (g/l) | 10 | 15 | 15 | 15 |
| Concentration of Pb in solution (g/l) | 5 | 8 | 10 | 15 |
| Sn (%) | 98 | 94 | 92 | 81 |
| Pb (%) | 2 | 6 | 8 | 19 |
| Thickness (μm) | 1.01 | 1.21 | 1.03 | 0.91 |

REFERENCE 1

A tin plating bath is prepared according to the composition shown in Table 24.

TABLE 24

| | |
|---|---|
| stannous chloride | 20 g/l |

TABLE 24-continued

| | |
|---|---|
| thiourea | 80 g/l |
| sodium ethylenediaminetetraacetate | 30 g/l |
| hydrazine hydrochloride | 20 g/l |
| hydrochloric acid | 50 ml/l |

Figure 7:
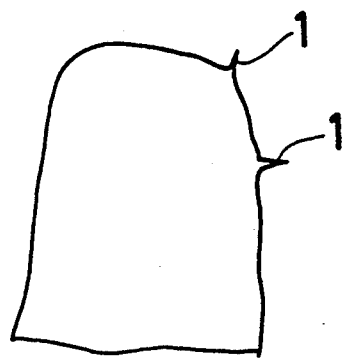
FIG. 7 shows the occurrence of whiskers in a prior art tin plating bath.

The tin plating has lower solderability than the tin-lead alloy plating. Furthermore, when an electronic circuit element is plated in the tin plating bath, whiskers, which adversely affect the reliability of the element, are observed as shown in FIG. 7.

REFERENCE 2

A tin-lead alloy plating bath is prepared according to the composition shown in Table 25.

TABLE 25

| | |
|---|---|
| stannous chloride | 20 g/l |
| lead chloride | 20 g/l |
| thiourea | 90 g/l |
| sodium ethylenediaminetetraacetate | 30 g/l |
| hydrazine hydrochloride | 20 g/l |
| hydrochloric acid | 50 ml/l |

The plating layer obtained consists of 72% tin and 28% lead, but the appearence is not uniform. When the plating bath is cooled, a large amount of thiourea complexes is precipitated, thus easily deteriorating the plating bath.

The bath for immersion plating tin-lead alloys of the invention is tested and the results are shown.

Figure 2:
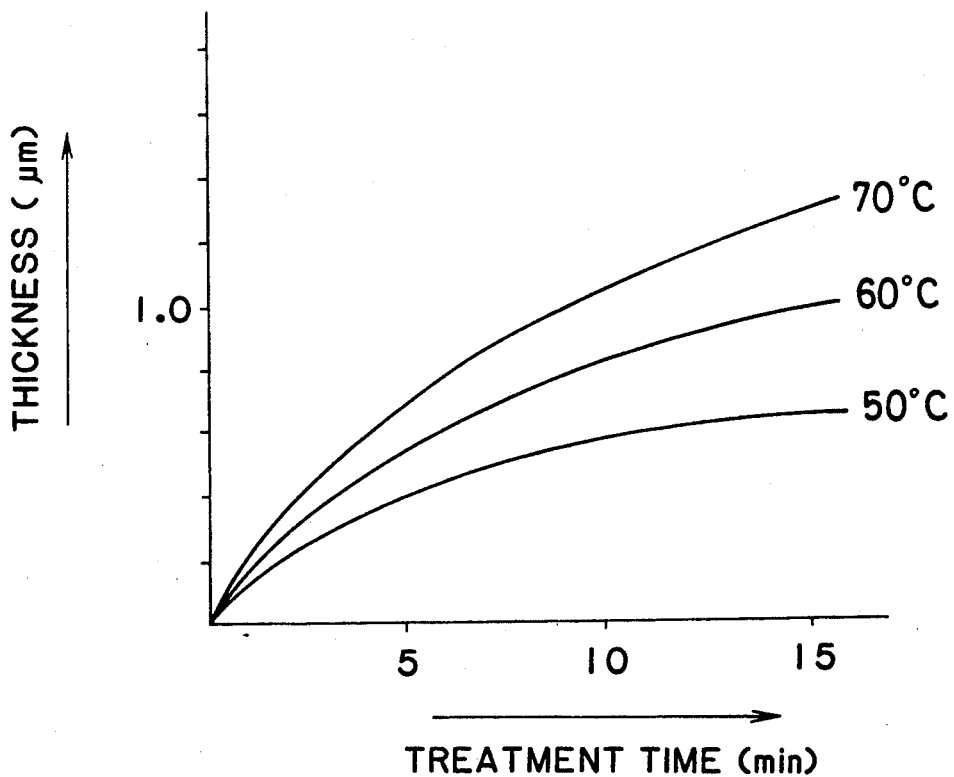
FIG. 2 shows the relationship between the treatment time and the thickness of the plating layer in a immersion plating bath of a second embodiment.

FIG. 2 shows the relationship between the treatment time and the thickness of the plating layer when a copper substance is plated with the immersion plating bath of the second embodiment. Even the plating baths at relatively low temperatures give a plating layer of a sufficient thickness.

Figure 3:
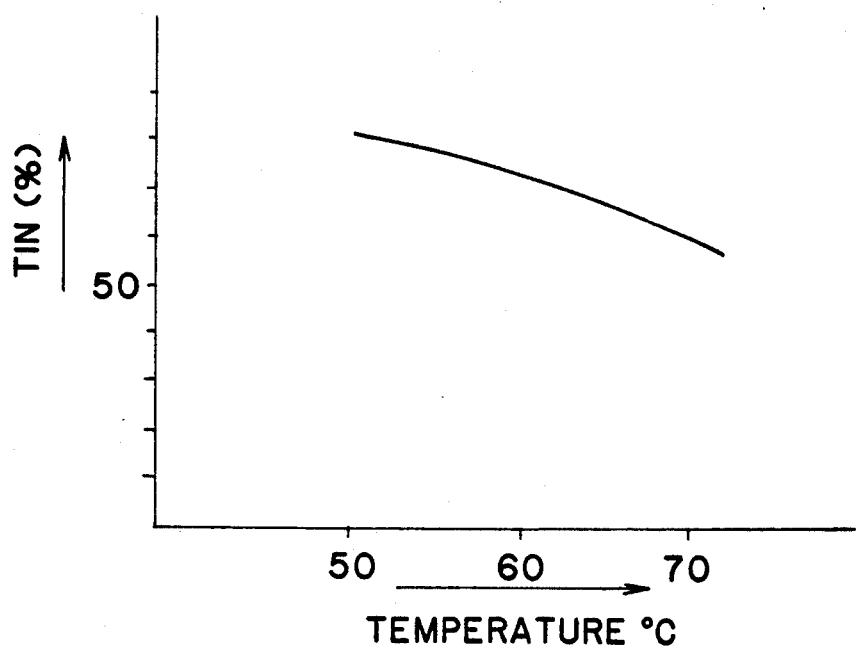
FIG. 3 shows the relationship between the temperature of the plating bath and the composition of tin-lead alloy deposited.

FIG. 3 shows the relationship between the temperature of the plating bath and the composition of tin-lead alloy deposited when a copper substance is dipped in the bath for 5 minutes. Even in the plating baths at relatively low temperatures, lead is uniformly deposited and thus a plating layer obtained has a desired composition.

Figure 4:
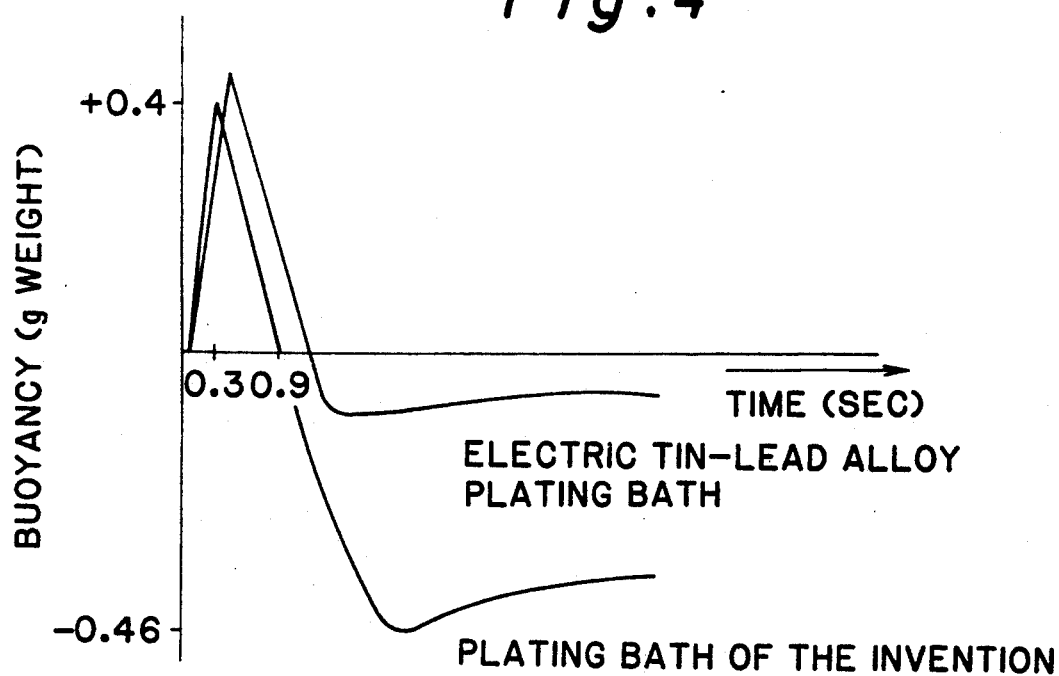
FIG. 4 shows the graphic patterns of the meniscograph solderability.

FIG. 4 shows the graphic patterns of meniscograph solderability (MIL-STD-883B METHOD 2022). The solderability of tin-lead alloy plating without a flux is checked imediately after plating using MENISCO GRAPHY, and Table 26 shows the results. The measurement conditions are: solder bath containing 60% tin and 40% lead at 235° C.; dip rate 25 mm/sec; dip depth 4 mm; plated substance is copper board of 50×5×0.3 mm. As shown in FIG. 4, at first the buoyancy increases with the increase of the dipped volume of the substance. In Table 26, T1 denotes the time when the buoyancy reaches its maximum, and F1 denotes the maximum buoyancy. The buoyancy then decreases to zero, at which the substance is completely dipped in the plating bath; that is, the contact angle between the solder bath and the substance becomes substantially 90 degrees. T2 denotes the time when the buoyancy becomes zero. The solder in the bath then rises on the surface of the substance and negative buoyancy is applied. F2 denotes the maximum negative buoyancy. The results with a general electric plating bath are also shown in FIG. 4 and Table 26 for comparison.

TABLE 26

| | Immersion tin-lead alloy plating of the invention | Electric tin-lead alloy plating |
|---|---|---|
| T1 (sec) | 0.3 | 0.4 |
| T2 (sec) | 0.9 | 1.2 |
| F1 (g weight) | 0.40 | 0.46 |
| F2 (g weight) | 0.46 | 0.06 |

As seen in Table 26, the immersion plating of the invention has smaller F1, larger F2 and smaller T2, compared with the electric plating tin-lead; that is, with the plating bath of the invention, the substance is sufficiently dipped in a short time and the plating gives excellent solderability. The deposited tin-lead alloy is thus stable and durable.

Table 27 shows the evaluation results when a copper substance with complicated and delicate patterns like electric circuit is plated with the immersion plating bath of the invention.

TABLE 27

| | |
|---|---|
| Appearance | good |
| Thickness of plating layer | 0.5~0.7 |
| Composition | lead 12~28% |
| Bondability | good |
| Heat-resistance (125° C. - 16 hr) | good |
| Solderability | good |
| PCT (heat-durability) | good |

Figure 5:
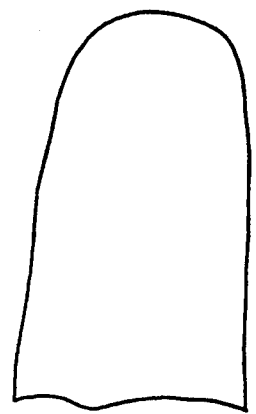
FIG. 5 shows the occurrence of whiskers in the plating bath of the invention.
Figure 6:
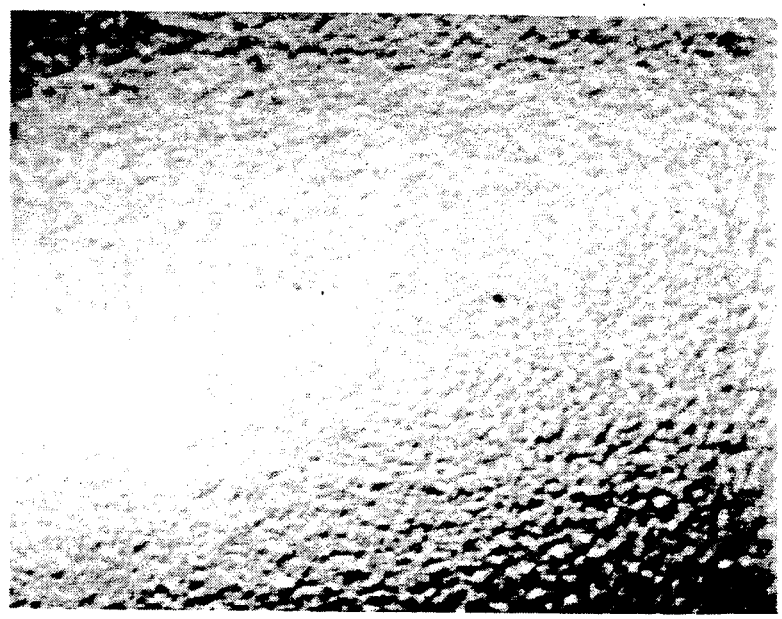
FIG. 6 is a photograph taken with an optical microscope showing the metal grain structures of the plating surface in the plating bath of the invention.
Figure 8:
FIG. 8 is a photograph taken with an optical microscope showing the metal grain structures of the plating surface in a immersion tin plating bath.
Figure 9:
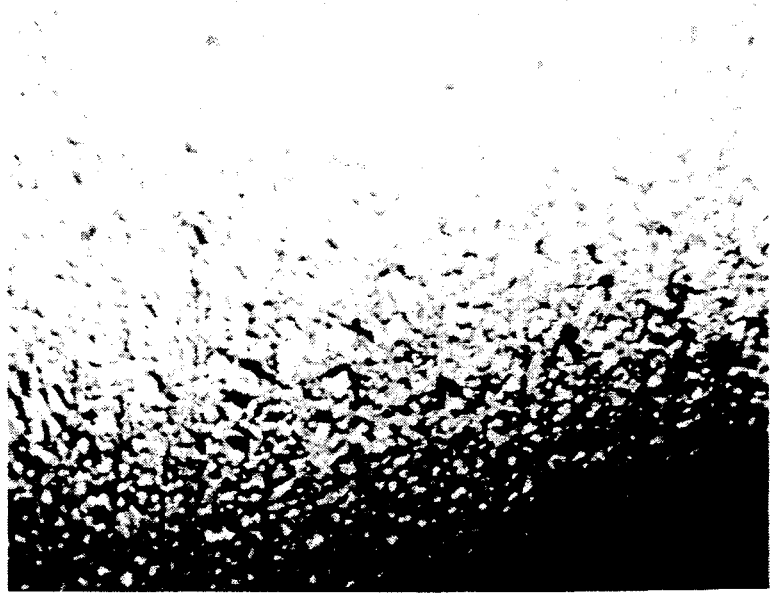
FIG. 9 is a photograph taken with an optical microscope showing the metal grain structures of the plating surface in a prior art immersion tin-lead alloy plating bath.

Whiskers are not observed in the plating bath of the invention as shown in FIG. 5. The plating bath of the invention gives fine plating surface because of the well-dispersed codeposition of fine grain sized tin and lead as shown in the photograph of FIG. 6 with an optical microscope, compared with those of FIG. 7 (conventional immersion tin plating bath) and FIG. 8 (conventional immersion tin-lead alloy plating bath).

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A plating bath for immersion plating a substance with a tin-lead alloy, and bath comprising:
   a. tin(II) ions,
   b. lead(II) ions,
   c. organic sulfo groups,
   d. thiourea,
   e. a thiourea derivative selected from the group consisting of
      dimethylol thiourea,
      1-acetyl-2-thiourea,
      monomethyl thiourea,
      dimethyl thiourea,
      trimethyl thiourea,
      monethyl thiourea and
      1,3-diethyl thiourea,
   f. aluminum chloride and
   g. a surfactant.
2. The plating bath as claimed in claim 1 wherein
   a. said tin(II) ions are present at a concentration of 3-40 g/l obtained from a compound selected from the group consisting of tin phenolsulfonates,
tin alkanesulfonates,
tin hydroxyalkanesulfonates and
water-soluble inorganic compounds containing tin,
b. lead(II) ions are present at a concentration of 3-50 g/l obtained from a compound selected from the group consisting of
lead phenolsulfonates,
lead alkanesulfonates,
lead hydroxyalkanesulfonates and
water-soluble inorganic compounds containing lead,
c. the organic sulfo groups are present at a concentration of 6-400 g/l,
d. thiourea is present at a concentration of 3-200 g/l, and
e. the thiourea derivative is present at a concentration of 12.5-40 wt % based on the amount of thiourea.

3. The plating bath according to claim 1 wherein the aluminum chloride is present in the amount of 0.01 to 0.2 mol/l.

* * * * *